(12) United States Patent
Voss et al.

(10) Patent No.: US 10,705,160 B2
(45) Date of Patent: Jul. 7, 2020

(54) TEMPERATURE COMPENSATION FOR MAGNETIC FIELD SENSING DEVICES AND A MAGNETIC FIELD SENSING DEVICE USING THE SAME

(71) Applicants: MEAS France, Toulouse (FR); TE Connectivity Sensors Germany GmbH, Dortmund (DE)

(72) Inventors: Andreas Voss, Dortmund (DE); Axel Bartos, Waltrop (DE); Fabien Gayrard, Saint Affrique (FR); Victor Conde, Toulouse (FR)

(73) Assignees: MEAS FRANCE, Toulouse (FR); TE CONNECTIVITY SENSORS GERMANY GMBH, Dortmund (DE)

( * ) Notice: Subject to any disclaimer, the term of this patent is extended or adjusted under 35 U.S.C. 154(b) by 63 days.

(21) Appl. No.: 15/992,333

(22) Filed: May 30, 2018

(65) Prior Publication Data

US 2018/0348311 A1 Dec. 6, 2018

(30) Foreign Application Priority Data

May 30, 2017 (EP) .................................. 17305621

(51) Int. Cl.
*G01R 33/09* (2006.01)
*G01F 23/76* (2006.01)
(Continued)

(52) U.S. Cl.
CPC ............. *G01R 33/09* (2013.01); *G01D 3/036* (2013.01); *G01F 23/74* (2013.01); *G01F 23/76* (2013.01)

(58) Field of Classification Search
CPC ......... G01R 33/09; G01F 23/76; G01F 23/74; G01D 3/036; G01B 7/02; G01B 7/003
(Continued)

(56) References Cited

U.S. PATENT DOCUMENTS

| 4,318,038 A * | 3/1982 | Munehiro | ............ H02K 41/031 310/13 |
| 4,535,289 A * | 8/1985 | Abe | ........................ G01D 5/147 324/207.12 |

(Continued)

FOREIGN PATENT DOCUMENTS

WO    2015165593 A1    11/2015

OTHER PUBLICATIONS

Fletcher, R.R. and Gershenfeld, N.A., 2000. Remotely interrogated temperature sensors based on magnetic materials. IEEE transaction (Year: 2000) (Year: 2000).*

(Continued)

*Primary Examiner* — Christopher P McAndrew

(57) ABSTRACT

A method of compensating for an effect of temperature includes providing a set of magnetic sensors arranged along a sensing path. Each magnetic sensor is adapted to sense a magnetic field created by a magnetic actuator which can move along the sensing path and to provide a sensing signal indicative of a position and/or a displacement of the magnetic actuator relative to the sensing path. The method includes selecting one or more magnetic sensors from the set of magnetic sensors for use as temperature sensors, estimating a distribution of temperature over at least a portion of the sensing path based on the sensing signals output by the one or more magnetic sensors selected as temperature sensors, and compensating for the effect of temperature on the sensing signals output by one or more magnetic sensors of the set of magnetic sensors using the distribution of temperature that was estimated.

20 Claims, 8 Drawing Sheets

(51) Int. Cl.
*G01D 3/036* (2006.01)
*G01F 23/74* (2006.01)

(58) Field of Classification Search
USPC .......................................................... 324/252
See application file for complete search history.

(56) References Cited

U.S. PATENT DOCUMENTS

| | | | | |
|---|---|---|---|---|
| 4,649,340 A * | 3/1987 | Zabler | ................... | B60T 8/4081 |
| | | | | 303/20 |
| 4,757,244 A * | 7/1988 | Iwamoto | ................ | G01B 7/003 |
| | | | | 318/652 |
| 4,839,590 A * | 6/1989 | Koski | .................... | G01B 7/003 |
| | | | | 324/207.13 |
| 4,939,457 A * | 7/1990 | Tellerman | ........... | G01F 23/2963 |
| | | | | 324/207.13 |
| 4,943,773 A * | 7/1990 | Koski | .................... | G01B 7/003 |
| | | | | 324/207.13 |
| 4,951,048 A * | 8/1990 | Ichikawa | ............ | F15B 15/2846 |
| | | | | 250/231.18 |
| 5,010,262 A * | 4/1991 | Nakagawa | ............... | B25J 9/123 |
| | | | | 310/12.21 |
| 5,050,430 A * | 9/1991 | Begin | .................... | G01B 7/003 |
| | | | | 324/207.13 |
| 5,072,179 A * | 12/1991 | Miller | .................. | G01D 5/2013 |
| | | | | 318/661 |
| 5,430,373 A * | 7/1995 | Ichikawa | ............... | G01D 5/145 |
| | | | | 324/207.21 |
| 5,530,345 A * | 6/1996 | Murari | ................... | G01D 5/145 |
| | | | | 257/426 |
| 5,535,625 A * | 7/1996 | Levy | .................. | G01F 23/2963 |
| | | | | 324/207.13 |
| 5,601,367 A * | 2/1997 | Nara | ...................... | G01K 7/183 |
| | | | | 338/25 |
| 5,680,041 A * | 10/1997 | Begin | .................... | G01B 7/003 |
| | | | | 324/207.12 |
| 5,929,631 A * | 7/1999 | Striker | .................. | G01D 5/145 |
| | | | | 324/207.21 |
| 5,998,991 A * | 12/1999 | Begin | .................. | G01F 23/443 |
| | | | | 324/207.13 |
| 6,018,881 A * | 2/2000 | Spies | ..................... | G01D 5/145 |
| | | | | 324/207.24 |
| 6,104,231 A * | 8/2000 | Kirkpatrick, II | ....... | G01R 33/07 |
| | | | | 327/378 |
| 6,476,602 B1 * | 11/2002 | Gray | ..................... | B82Y 10/00 |
| | | | | 324/210 |
| 7,209,028 B2 * | 4/2007 | Boronkay | .............. | G01D 5/165 |
| | | | | 324/714 |
| 7,237,952 B2 * | 7/2007 | Ishihara | .................. | G01K 7/36 |
| | | | | 374/185 |
| 7,971,487 B2 * | 7/2011 | Carlen | .................... | G01D 18/00 |
| | | | | 73/760 |
| 8,129,984 B2 * | 3/2012 | Hosek | ..................... | G01B 7/003 |
| | | | | 324/207.15 |
| 9,297,634 B2 | 3/2016 | Bartos et al. | | |
| 9,804,006 B2 * | 10/2017 | Nomiyama | .............. | G01D 5/16 |
| 10,041,810 B2 * | 8/2018 | Vig | ........................ | G01D 5/147 |
| 2005/0189938 A1 * | 9/2005 | Schley | ................... | G01D 5/145 |
| | | | | 324/207.15 |
| 2010/0231213 A1 | 9/2010 | Nieuwenhuis et al. | | |
| 2012/0086442 A1 | 4/2012 | Haas et al. | | |
| 2013/0200887 A1 * | 8/2013 | Bartos | .................... | G01D 5/145 |
| | | | | 324/207.24 |
| 2016/0155282 A1 * | 6/2016 | Miura | ..................... | G01R 33/09 |
| | | | | 209/567 |
| 2017/0074715 A1 | 3/2017 | Bartos et al. | | |

OTHER PUBLICATIONS

European Search Report, dated Nov. 24, 2017, 7 pages.
Abstract of WO2015165593, dated Nov. 5, 2015, 1 page.

* cited by examiner

TEMPERATURE COMPENSATION FOR MAGNETIC FIELD SENSING DEVICES AND A MAGNETIC FIELD SENSING DEVICE USING THE SAME

CROSS-REFERENCE TO RELATED APPLICATION

This application claims the benefit of the filing date under 35 U.S.C. § 119(a)-(d) of European Patent Application No. 17305621.9, filed on May 30, 2017.

FIELD OF THE INVENTION

The present invention relates to a magnetic field sensing device and, more particularly, to a magnetic field sensing device used to detect a relative position or displacement of a movable magnet.

BACKGROUND

Magnetic field sensing devices are widely used for contactless measurements of position and/or displacement in a broad range of technical fields, such as automotive applications, manufacturing, agricultural machines and consumer devices. Many of such measurement systems are based on detecting the position of a movable element along a measurement path by sensing the magnetic field created by the movable element, such as a permanent magnet, using magnetic field sensors distributed along the measurement path. For instance, magnetic sensors are frequently employed for measuring linear displacement of pistons in pneumatic and hydraulic cylinders and for level measurements of fluids in containers, such as in industrial ink tanks, diesel exhaust fluid ("DEF") tanks, and fuel tanks. In general, the sensing signal output by each magnetic sensor varies with the strength of the applied magnetic field according to a known characteristic curve. Because the strength of the magnetic field applied to each magnetic sensor depends on the distance between the movable magnet and the respective magnetic sensor, the relative position of the movable magnet can be determined by analyzing the amplitude of the sensing signals acquired by a chain of sensors along the measurement path.

U.S. Patent Application No. 2005/0189938 A1, for example, describes a system and method for measuring the position of a movable magnet, in which the output from a chain of sensors (e.g., Hall effect sensors) is curve fit using an algorithm having a characteristic bell curve to determine an absolute and/or relative position associated with the magnet.

International Patent Application No. WO 2015/165593 A1 describes a similar example of a method and device for measuring the level of a liquid in a container in which the position of a movable float is determined by detecting the magnetic field created by the float with a line of magnetic field-sensitive sensor elements. The magnetic field generated by the float extends along the sensor line, which is substantially parallel to the measurement path, and is more intense at the sensors that are situated closest to the float. As a result, the signals acquired along the sensor line form a signal profile whose amplitude depends on the relative position of the float along the measurement path.

U.S. Pat. No. 9,297,634 B2 describes a device for generating a sensor signal, the profile of the sensor signal depending on the position of a magnetic field-generating element relative to the device. In this case, the sensor signal is obtained using at least two magnetically sensitive sensors disposed along a measurement path and a support field device. The support field device generates a magnetic support field in the magnetically sensitive sensors that has at least in the magnetically sensitive sensors an essentially identical direction and homogeneous field strength. The sensor signals can be represented as a table, which assigns a measurement value for the present position of the movable magnet to each sensor. Because the position of the sensors along the linear measurement path is already known, the table-like presentation corresponds to a representation of the signal progression in which the progression of measurement values is represented along a linear X-coordinate (the measurement path). The position of the element, at which it is located when the progression of the sensor signal is generated, is thereby determined by comparing the acquired progression with a stored reference progression.

The magneto-resistive magnetic sensors employed in many of the conventional techniques have a field response that depends on the applied magnetic field but may also depend on a temperature of the sensor. If the actual sensor temperature is not known and accounted for, the effect of temperature on the sensing signal may reduce the precision of the position and/or displacement measurement. Further, when detecting the position or displacement of a movable magnet using a chain of magnetic sensors that are affected by a temperature gradient along the chain, the precision of the measurement could be reduced since the distribution of temperature over the sensors will be reflected on the amplitude of the respective sensing signals and distort the signal profile obtained from the sensed magnetic field distribution.

Temperature gradients are inherent to main applications, such as fluid tanks. The effect of temperature gradients in the accuracy of position measurements performed using a chain of magnetic sensors might be particularly relevant for fluid level measurement devices, since the temperature of the fluid well below the liquid surface might be significantly different from the temperature at the liquid surface. In addition, since quite often the temperature distribution along the fluid depth is not known, it is assumed that the chain of sensors is at a homogeneous temperature, thereby affecting the precision of the level measurement.

In order to take into account temperature gradient effects, a temperature sensor could be provided close to each magnetic sensor for measuring the actual temperature of the respective magnetic sensor. However, this implies an increase in the volume of the measurement device as well as in production costs. Therefore, there is a need for a cost-effective solution that allows improving the accuracy of position and/or displacement measurements performed with magnetic sensing devices, and in particular, for magnetic sensing devices suitable for level or position measurements in environments where the establishment of temperature gradients can be expected.

SUMMARY

A method of compensating for an effect of temperature includes providing a set of magnetic sensors arranged along a sensing path. Each magnetic sensor is adapted to sense a magnetic field created by a magnetic actuator which can move along the sensing path and to provide a sensing signal indicative of a position and/or a displacement of the magnetic actuator relative to the sensing path. The method includes selecting one or more magnetic sensors from the set of magnetic sensors for use as temperature sensors, estimating a distribution of temperature over at least a portion of the sensing path based on the sensing signals output by the one or more magnetic sensors selected as temperature sensors, and compensating for the effect of temperature on the sensing signals output by one or more magnetic sensors of the set of magnetic sensors using the distribution of temperature that was estimated.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
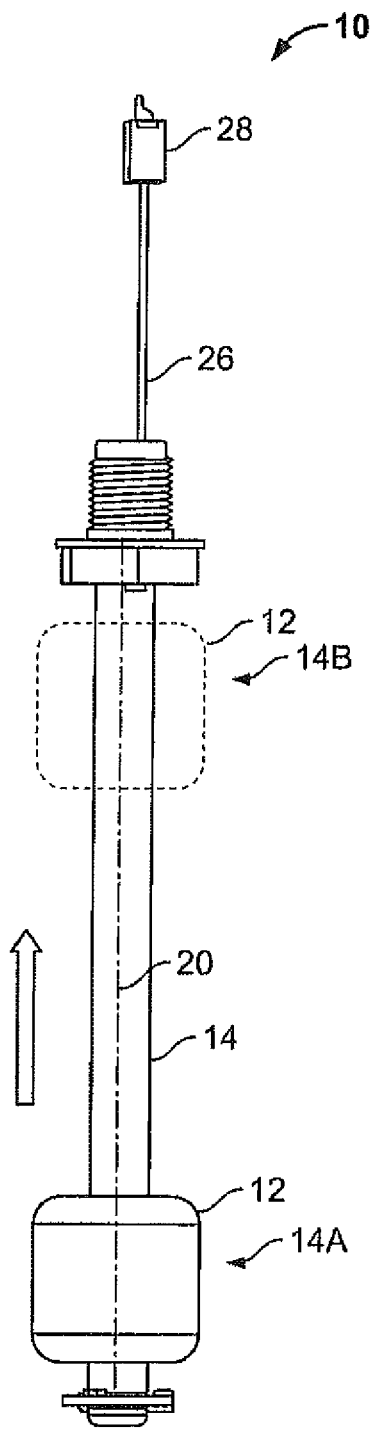
FIG. 1 is a side view of a magnetic field sensing device according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

Figure 2:
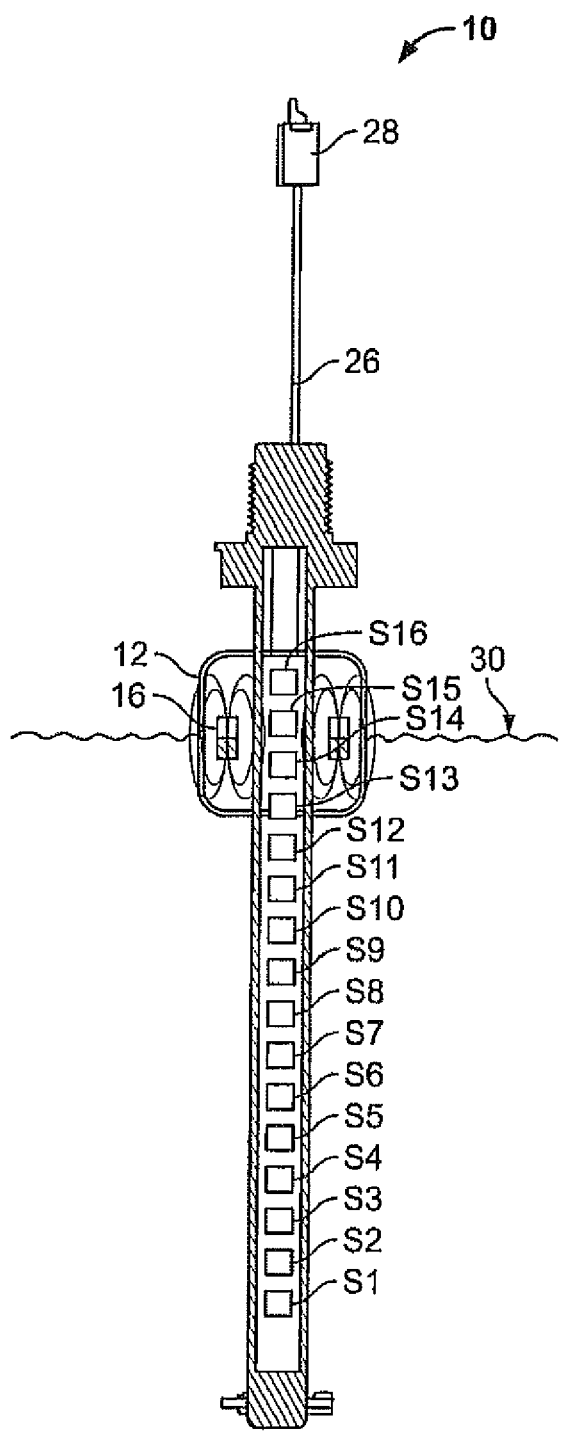
FIG. 2 is a sectional side view of the magnetic field sensing device of FIG. 1.

A magnetic field sensing device 10 according to an embodiment is shown in FIGS. 1 and 2. The magnetic field sensing device 10 includes a movable element 12 and a guide 14 along which the movable element 12 can be displaced between an upper position 14A and a lower position 14B. The guide 14 constitutes a sensing path 20 of the magnetic field sensing device 10.

The magnetic field sensing device 10, as shown in FIG. 2, comprises a set of magnetically sensitive sensors S1 to Sn (n=total number of magnetic sensors in the set) that are distributed in a specific spatial arrangement with respect to the guide 14. The magnetically sensitive sensors S1 to Sn deliver sensing signals indicative of the magnetic field generated by the movable magnetic element 12 at each location of the magnetic sensors S1 to Sn, and therefore, deliver signals indicative of the relative position and/or displacement of the movable magnetic element 12 along the guide 14. In the shown embodiment, the magnetic field sensing device 10 includes a set of n=16 magnetic sensors. In other embodiments, the number of magnetic sensors is not limited to 16 and one or a plurality of magnetic sensors may be used, depending on the application.

The movable element 12, as shown in FIG. 2, includes a magnetic-field generator 16 creating a magnetic field distribution that is sensed by each of the magnetically sensitive sensors S1 to Sn. The movable element 12 acts as a magnetic actuator that actuates each of the magnetically sensitive sensors S1 to Sn with a magnetic field intensity that varies depending on its position and/or displacement relative to the sensing path 20. This relative position can then be inferred from the variation of the sensing signals output by the magnetic sensors S1 to Sn along the sensing path 20. In the shown embodiment, the magnetic-field generator 16 is an annular magnet. In other embodiments, the magnetic-field generator 16 and respective magnetic field distribution may be a magnet with other shapes and magnetic field directions, and may include any number of magnets in any arrangement.

Figure 5:
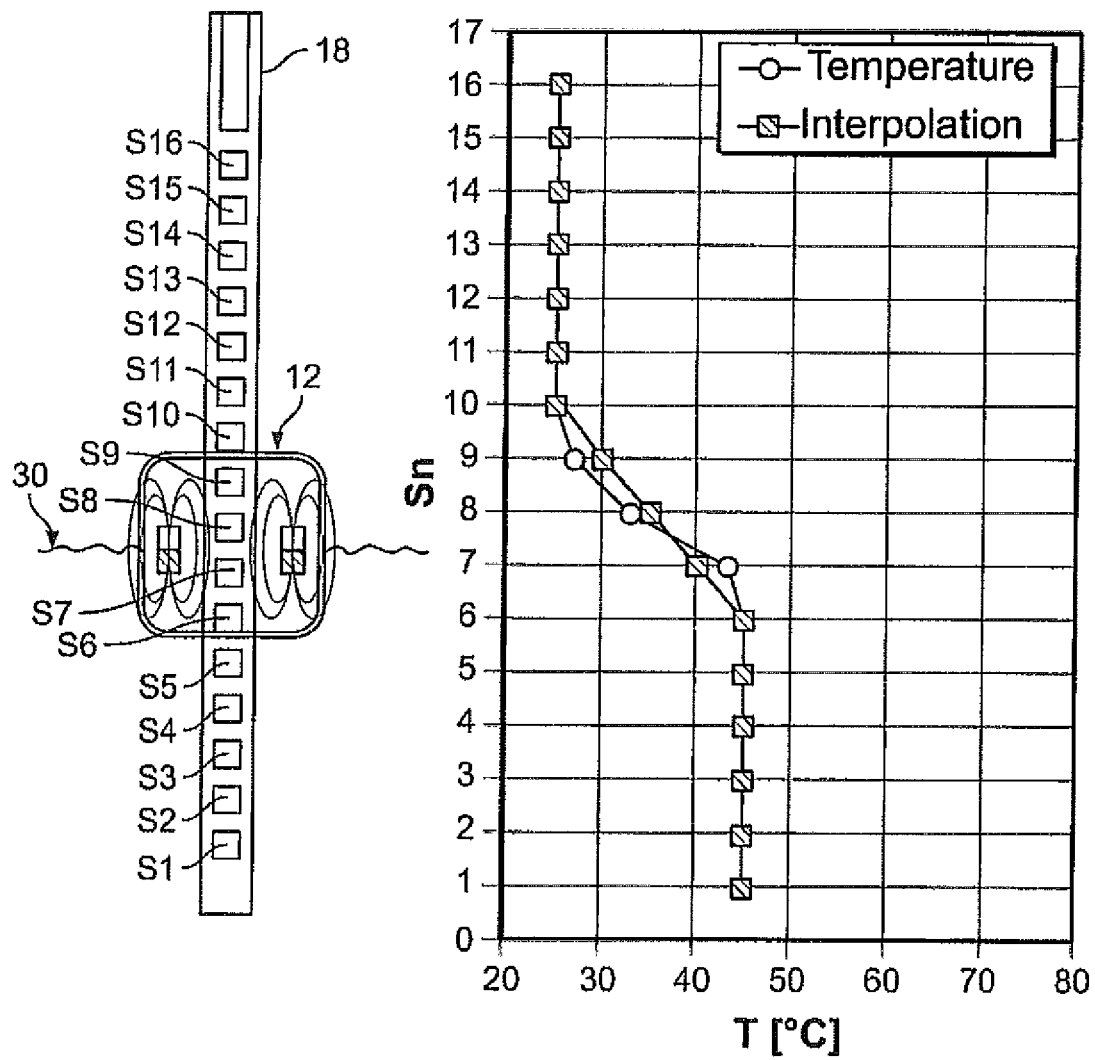
FIG. 5 is a sectional side view of the magnetic field sensing device and a graph of a temperature distribution along the plurality of magnetic sensors of the magnetic field sensing device.

The magnetic sensors S1 to Sn, in the embodiment shown in FIGS. 1, 2, and 5, are evenly distributed over the sensing path 20 as a linear array 18 essentially parallel to the sensing path 20. The spatial arrangement of the set of magnetic sensors S1 to Sn may vary in other embodiments. For instance, the magnetic sensors S1 to Sn may be distributed in a linear arrangement with different spacing, such as with increased density of magnetic sensors at certain areas of the sensing path for increased resolution, or in a circular arrangement for sensing position and/or displacement of the movable element 12 along a circular sensing path.

Each of the magnetic sensors S1 to Sn may be of the same magnetic sensor type and have similar sensor parameters so as to provide a similar response under the same temperature and magnetic field conditions. At each position of the magnetic actuator 12 over the sensing path 20, each of the magnetic sensors S1 to Sn output sensing signals with amplitudes that are essentially affected by the local strength of the sensed magnetic field, i.e. the relative position of the magnetic actuator 12, and the sensor temperature.

The magnetic field sensing device 10 is a level measurement device in the embodiment shown in FIGS. 1 and 2. The movable element 12 has a floating body suitable for floating at the surface of the fluid to be measured and housing the magnetic-field generator 16. The guide 14 is a sealed cylindrical tube inside which the sensor array 18 is arranged to isolate the sensors and respective electronics from contact with the external fluid. The magnetic field sensing device 10 can be used for other types of measurements in other embodiments, such as position measurements, and therefore, benefit from the temperature compensation described herein.

The magnetic field sensing device 10, as shown in FIGS. 1 and 2, further comprises an additional guide 26 for guiding a plurality of electrical wires connected to the sensor array 18 to an electrical connector 28 for coupling the array 18 with a signal processor. The sensing signals are acquired by the signal processor, which processes the acquired sensing signals so as to estimate the temperature distribution along the sensor array 18, as it will be described in greater detail below.

The temperature compensation method described herein uses magnetic sensors S1 to Sn having a known characteristic behavior to applied magnetic field and temperature for inferring the local temperature at one or more magnetic sensors Si selected from the set and/or for estimating a temperature gradient established over at least a portion of the sensor path 20.

In an embodiment, a type of magnetic sensor S1 to Sn that may be used for inferring local temperature from the sensor sensing signals is a magnetic weak-field sensor. This type of magnetic sensor, when under a fixed temperature T and an uni-directional magnetic field applied to the surface parallel to the chip plane (x-y plane), for example along the y-axis, delivers sensing signals that follow a known characteristic curve for the specific temperature as a function of the applied field Hy. The characteristic curves for different temperatures intersect at a magnetic field strength, Hs, at which the magnetic sensor response is essentially independent of temperature.

Figure 3:
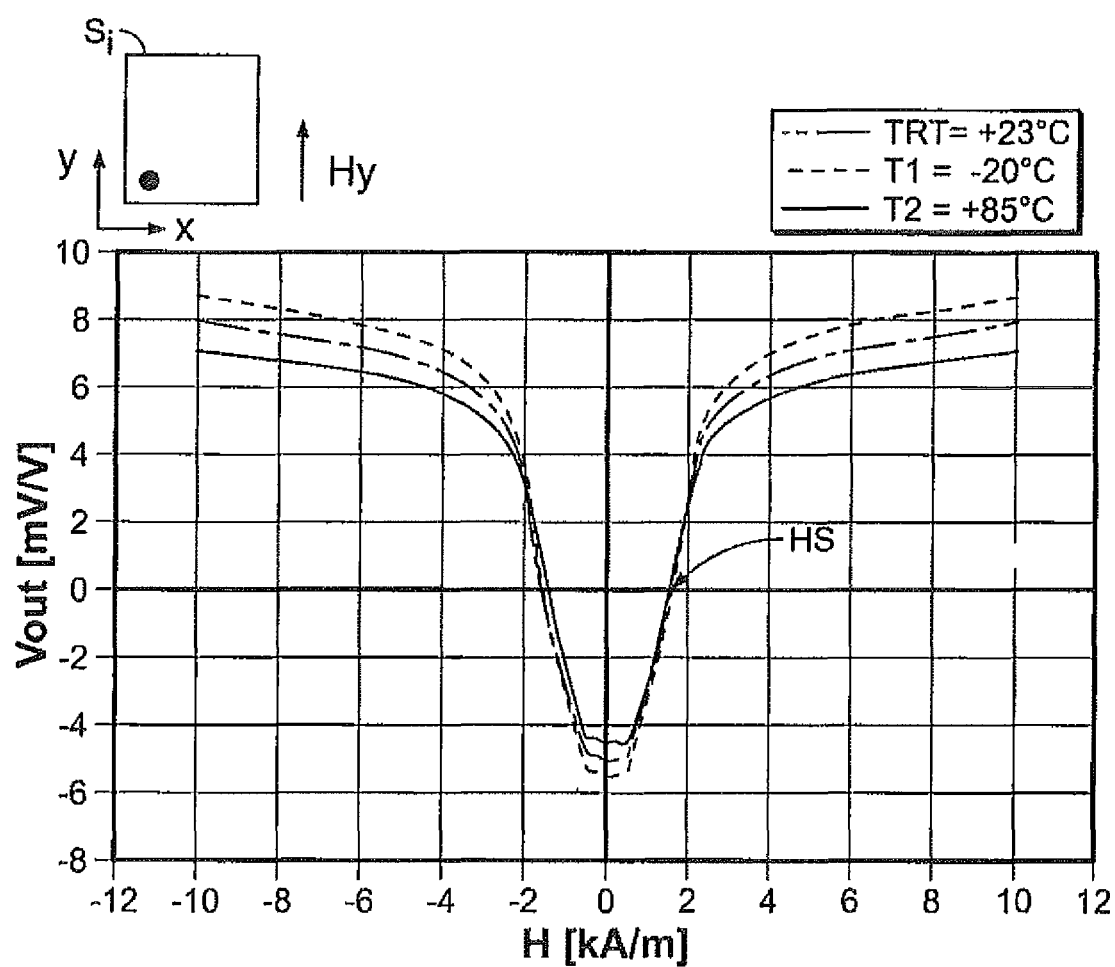
FIG. 3 is a graph of a curves of an output voltage signal versus an applied magnetic field at a plurality of different temperatures.

FIG. 3 depicts examples of characteristic curves of the output voltage signal $V_{out}$ for a magnetic weak-field sensor as a function of applied field Hy at temperatures: $T_{RT}$=23° C., T1=−20° C. and T2=85° C. In the example shown in FIG. 3, the magnetic switching field is set at Hs=1.85 kA/m. Over a wide magnetic field range about the switching field Hs, the characteristic curves $V_{out}$ (H) are substantially linear. On the other hand, the magnetic sensor exhibits negligible field sensitivity at magnetic field strengths Hy close to zero. In this field range, the magnetic sensor delivers an output voltage signal $V_{out}$ that is essentially characterized by an offset voltage $V_{offset}$ that mainly depends on temperature. The offset voltage $V_{offset}$ substantially follows a linear dependency on temperature that is expressed by the equation:

$$V_{offset}(T)=V_{offset}(T_{ref})+TC_{offset}(T-T_{ref}) \quad (1)$$

wherein $T_{ref}$ is a reference temperature;
$V_{offset}$ ($T_{ref}$) is the offset voltage at $T_{ref}$; and
$TC_{offset}$ is a temperature coefficient for the offset voltage.

The reference temperature $T_{ref}$ can be any temperature at which the value of the offset voltage $V_{offset}$ ($T_{ref}$) is known. In the example illustrated in FIG. 3, the temperature coefficient $TC_{offset}$ has a characteristic constant value within a temperature range from −25° C. to +85° C., which can be obtained from measurement values of the offset voltage at two known temperatures, or from the specification data of the magnetic sensor.

When using magnetic sensors of the magnetic weak field type described above, if a magnetic sensor of the array 18 is not being actuated by the magnetic field because it is sufficiently distanced from the magnetic actuator 12, it can be assumed that the output voltage $V_{out}$ of the measured sensing signal follows Equation (1) and the sensor temperature T may then be calculated using the measured output voltage $V_{out}$ and the known parameters $TC_{offset}$, $V_{offset}(T_{ref})$, at a predetermined reference temperature $T_{ref}$. The values of the parameters $TC_{offset}$, $V_{offset}(T_{ref})$, and $T_{ref}$ are sensor specific and are available from the respective technical specification data, typically for a reference temperature of 25° C.

Although the embodiment above has been described with reference to a magnetic weak-field sensor characterized by the offset voltage $V_{offset}$ of Equation 1, magnetic sensors other than the magnetic weak-field sensor described with reference to FIG. 3 may be used. In general, any magnetic sensor having a response to magnetic field and temperature that essentially follows a known temperature behavior when the magnetic sensor is not being affected or is only negligibly affected by a magnetic field can be used for implementing the present invention. In this case, the estimation of the local temperature may still be performed based on the measurement signal output by the magnetic sensor and respective characteristic temperature and magnetic field behavior by using the characterization curves specific to that type of magnetic sensor.

The known temperature behavior of the specific type of magnetic sensors at low magnetic fields may be used for inferring not only the local sensor temperature but also for estimating the temperature distribution over at least a part of the sensing path 20.

As shown in FIG. 2, the magnetic sensors S1 to Sn are arranged such as to substantially cover the total length of the sensing path 20, and the magnetic actuator 12 is designed so as to create a magnetic field distribution that essentially actuates on a small number of array sensors situated closer to the current position of the magnetic actuator 12 and has a negligible effect on the other sensors of the array 18. Thus, based on the sensing signals output by each of the magnetic sensors S1 to Sn, it is possible to identify one or more magnetic sensors that are sufficiently distanced away from the magnetic actuator 12 and therefore, negligibly influenced by the generated magnetic field.

Figure 4:
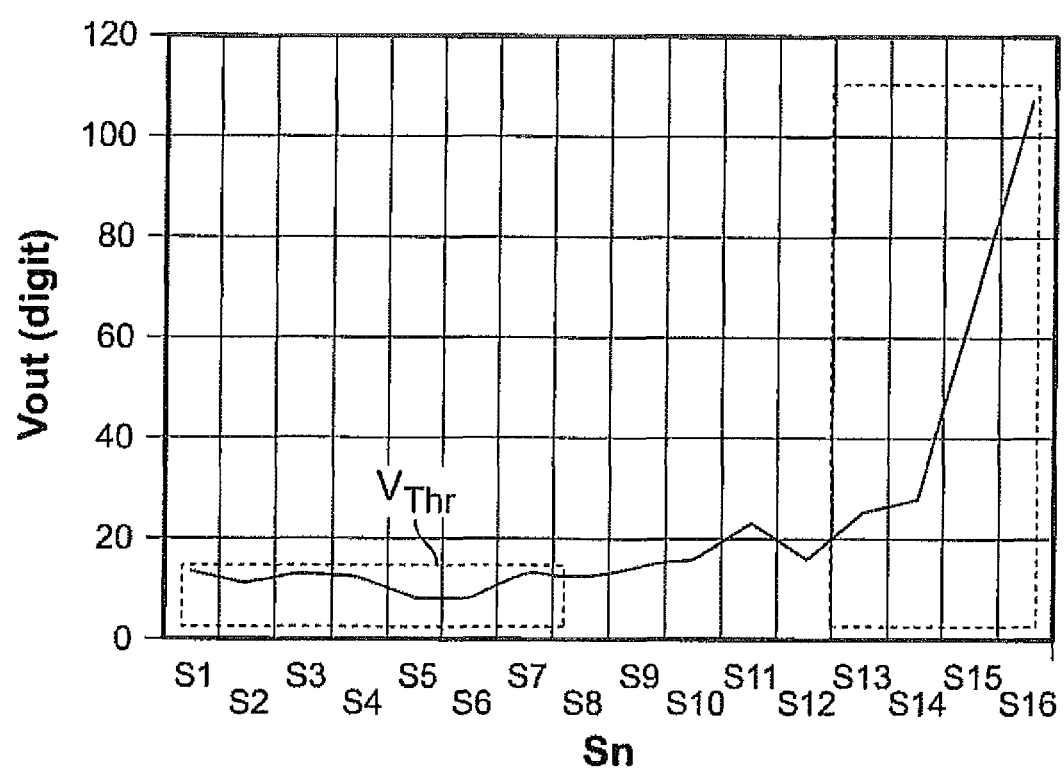
FIG. 4 is a graph of a plurality of sensing signals of a plurality of magnetic sensors of the magnetic field sensing device.

FIG. 4 illustrates an example of amplitudes of sensing signals acquired for each of the array magnetic sensors S1 to S16 (after digitizing the raw, analog sensing signals with dedicated circuitry) when the magnetic actuator 12 is at the upper position 14B shown in FIG. 2. In this position, the magnetic actuator 12 essentially influences the sensing signals output by sensors S13 to S16, which are closer to the magnetic actuator 12, with the highest amplitude signals being attained for sensors S15 and S16. On the other hand, the effect of the magnetic field decreases significantly for the sensors situated towards the other end of the array 18, with the result that the amplitudes of the respective sensing signals decrease and become essentially affected by the temperature at the respective magnetic sensor. For instance, the sensors S1 to S7 at the other opposed end of the sensing path 20 output significantly weaker sensing signals with amplitudes that reach only 15% of the maximum amplitude obtained for sensor S16.

When using an array of magnetic sensors that provide a response that depends essentially on temperature only at magnetic fields close to zero, for a current position of the magnetic actuator 12 only certain magnetic sensors of the array 18 can therefore be reliably used as temperature sensors. The respective local temperatures are calculated from the sensing signals of these selected sensors and the respective characteristics, such as in Equation (1) described above. The distribution of temperature over the entire or at least a portion of the sensor array 18 may then be estimated from the local temperatures calculated for the selected magnetic sensors. The estimated temperature distribution may then be used for compensating effects of temperature in the sensing signals output by each or at least a number of the magnetic sensors in the array 18, as will be described hereinafter.

In order to identify and select the magnetic sensors whose sensing signals are not being affected by the magnetic field created by the magnetic actuator 12, the sensing signals output by each of the array sensors can be evaluated and a filtering function applied for separating the array sensors into two categories: (1) array sensors whose sensing signals are affected by both sensed magnetic field and sensor temperature and therefore, will not be used as temperature sensors, and (2) array sensors for which the sensing signals essentially depend only on the sensor temperature and therefore, can be selected as temperature sensors.

In an embodiment, the filtering function is implemented by predefining an amplitude range, such as by pre-setting a maximum threshold amplitude value $V_{thr}$, for which it can be safely assumed that the response from the respective magnetic sensor is not being influenced by the magnetic actuator 12 if the amplitude of the respective sensing signal changes within the predetermined amplitude range and/or is below the pre-set threshold. A comparison of the sensing signals acquired from all or a number of the magnetic sensors S1 to Sn against the predetermined amplitude range then allows identifying the magnetic sensors whose sensing signals change within the predefined amplitude range, and select a number of magnetic sensors for the estimation of temperature along the chain from the sensors that fulfill this condition.

For instance, referring to FIG. 4, the predetermined threshold value $V_{thr}$ may be set to a specific value of the sensing signal amplitude that is expected to be measured when the magnetic sensor is sensing a negligible magnetic field. By comparing the sensing signals acquired from all of the magnetic sensors S1 to Sn with the predetermined threshold value, it is then possible to identify the magnetic sensors that are sufficiently distant from the magnetic actuator 12 and therefore, not significantly influenced by the generated magnetic field, by determining which sensors have signal amplitudes equal to or below the predetermined threshold value, such as the sensing signals associated with the sensors S1 to S8 shown in FIG. 4. It is understood that the predetermined threshold value is to be selected depending on the characteristics of the magnetic sensing device 10 and the expected amplitude range of the sensing signals obtained from the respective magnetic sensors when under or without the influence of a magnetic field.

In an alternative embodiment, the filtering function may be implemented by setting an upper threshold value corresponding to an amplitude value that can be regarded as being already affected by the magnetic actuator 12, and by discarding all of the magnetic sensors that output sensing signals with an amplitude higher than the upper threshold value for use as temperature sensors.

After one or more of the magnetic sensors S1 to Sn have been identified as not being affected by the magnetic actuator 12, a distribution of temperature over the sensor array 18 can be estimated based on the sensing signals from a selected number of the identified magnetic sensors. First, the temperature $T_i$ at each of the selected magnetic sensors Si is calculated using the characteristic law $V_{out}$ (T) for the specific magnetic sensor at zero magnetic field. For instance, in the case of magnetic sensors that follow Equation (1) described above, the temperature $T_i$ at each of the selected magnetic sensors Si may be calculated from the sensing signals $V_{offset,i}$ measured by the respective sensor Si, and the known sensor parameters for the temperature coefficient $TC_{offset}$ and offset voltage $V_{offset,i}$ ($T_{ref}$) at the reference temperature $T_{ref}$, using the equation:

$$T_i = \frac{V_{offset,i}(T) - V_{offset,i}(T_{ref})}{TC_{offet}} + T_{ref} \qquad (2)$$

The calculated temperatures Ti provide an indication of the actual temperature at the respective position of the selected sensor Si.

The temperatures at the non-selected magnetic sensors Sj, which have been discarded for calculating temperature, can then be estimated from the temperature values Ti calculated for the selected sensors Si based on a suitable function that depends on the application, such as a known law for the establishment of temperature gradients in fluids, and the like. For instance, as shown in FIG. 5, an interpolation function may be used in the case that the magnetic actuator 12 is situated at an intermediate position along the sensing path 20, and the selected sensors include a group of sensors above and below an intermediate array region of non-selected sensors Sj (j=5 to 10). Examples of interpolation functions that can be used include a linear interpolation function and a log interpolation function. In addition, an extrapolation function may be used for estimating temperatures at non-selected sensors Sj that are located at one of the ends of the sensor chain S1-Sn, and the group of selected sensors Si is located at the opposed side of the sensor chain S1-Sn, such as in the case illustrated in FIG. 2. Interpolation and extrapolation methods used for estimating temperature gradients within fluids are well-known in the respective technical field, and therefore, will not be further detailed here. Moreover, the temperature distribution may be estimated for all the magnetic sensors S1 to Sn, i.e. over the entire sensing path 20 as described above, or only for a group of the magnetic sensors covering only a portion of the sensing path 20.

FIG. 5 shows an example of temperature values obtained at respective positions of the sensors S1 to Sn (in the illustrated example n=16) along the sensing path 18 using the method described above. In the example illustrated in FIG. 5, the guide 14 and sensor array 18 are partially immersed in a hot fluid at about 45° C. and the magnetic actuator 12 floats on the fluid surface 30 at an intermediate position between sensors S7 and S8. The fluid surface 30 is in contact with air at an ambient temperature of 25° C. In the shown embodiment, the influence of the magnetic field on the magnetic sensors located close to both end sides of the sensor array 18 is negligible and the sensing signals from the sensors above and below the intermediate region, for e.g. sensors S1 to S4 and S11 to S16, have been used for calculating the respective sensor temperatures using Equation (2).

In FIG. 5, the temperature across the fluid-air interface, i.e. for the intermediate sensors S5 to S10, has been estimated by linear interpolation from the temperatures calculated for sensors S1 to S4 and S11 to S16. For comparison, the actual temperature values at respective sensor positions are represented in the graph of FIG. 5 with closed symbols. The estimated temperature values obtained using the method explained above are represented with open symbols. As it can be seen, the actual temperature of the fluid at a depth corresponding to the position of sensors S1 to S5 has a constant value of 45° C. but decreases substantially close to the fluid surface due to thermal exchange with the air above the fluid level 30, thereby leading to a significant temperature gradient being established over the sensors S6 to S7 that are close to the magnetic actuator 12 position. Moreover, the sensors S8 to S6 above the fluid level 30 are also under a significant temperature gradient as the surrounding temperature above the fluid level 30 continues to decrease until stabilizing at the ambient temperature of 25° C. In such a situation, the sensing signals from the sensor array are significantly influenced by the temperature gradient.

Figure 6:
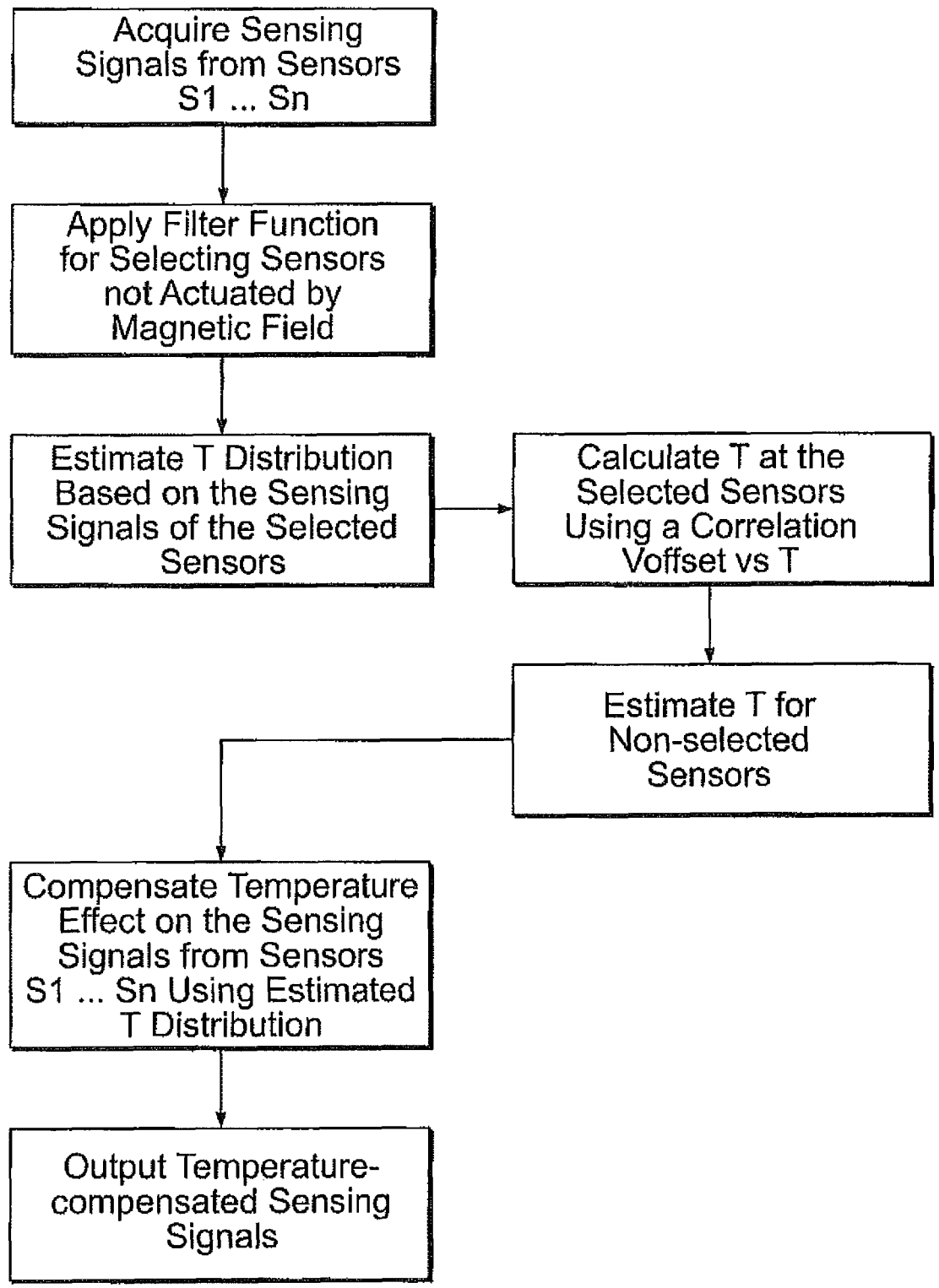
FIG. 6 is a flowchart of a temperature compensation method according to an embodiment.

In a case where the magnetic actuator 12 is located at or close to one of the lower and upper ends of the sensor array 18, such as in the case illustrated in FIGS. 1 and 2, there is only magnetic sensors situated at one side of the magnetic actuator 12 position that can be selected for calculating the temperature. In this case, as mentioned above, the distribution of temperature over the magnetic sensors situated closer to the magnetic actuator 12 may be estimated by linear extrapolation from the temperature values calculated from the selected sensors at the opposed side of the sensor array 18. A flowchart showing steps of the temperature compensation method according to an embodiment is shown in FIG. 6.

The estimated distribution of temperature may be used for compensating temperature effects in the raw sensing signals acquired from the magnetic sensor array, for e.g. using the known characteristic curves or a generic temperature law, of the output voltage Vout versus applied magnetic field for the magnetic sensor, and outputting temperature-compensated sensing signals. The use of a formula for compensating the effect of temperature gradients in the raw sensing signals allows a continuous temperature compensation without need of using previously stored, reference values for the measured sensing signals obtained for a discrete number of positions of the magnetic actuator along the sensing path 20.

For instance, the characteristic curves for the output voltage signal $V_{out}$ versus the applied magnetic field Hy at a fixed temperature, as shown in FIG. 3, may be represented by the following law $U_{fit}(H)$:

$$U_{fit}(H) = A(T) + B(T) \cdot \sum f_n \cdot a_n \text{ with} \qquad (3)$$

$$a_n = \begin{cases} |H| \le c_n: & \dfrac{2 \cdot \left(\dfrac{H}{c_n}\right)^2}{3} \\ |H| > c_n: & 1 - \dfrac{1}{4 \cdot \dfrac{H}{c_n} - 1} \end{cases}$$

in which A(T) and B(T) are temperature dependent coefficients characteristic of the magnetic sensor that may be expressed as $A(T)=0.01998 \times T-5.62869$ $B(T)=-0.05385 \times T+14.34329$ and T is temperature in Celsius degree.

When the magnetic field actuating on the magnetic sensor is negligible, the temperature T at the magnetic sensor may be estimated using the above law $U_{fit}(H)$ at zero field, which leads to:

$T=(U_{fit}(H)+5.62869)/0.01998$ \qquad (4)

Figure 7:
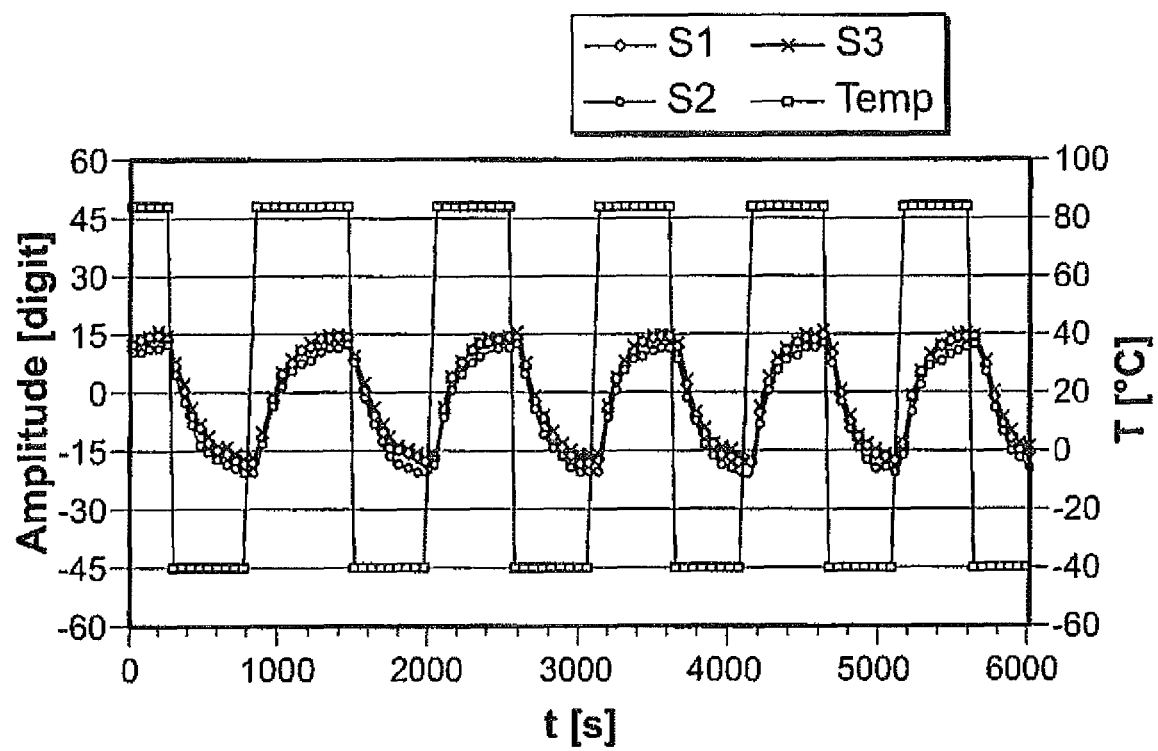
FIG. 7 is a graph of an amplitude of the plurality of sensing signals of some of the plurality of magnetic sensors over time under a cyclic variation in temperature.
Figure 8:
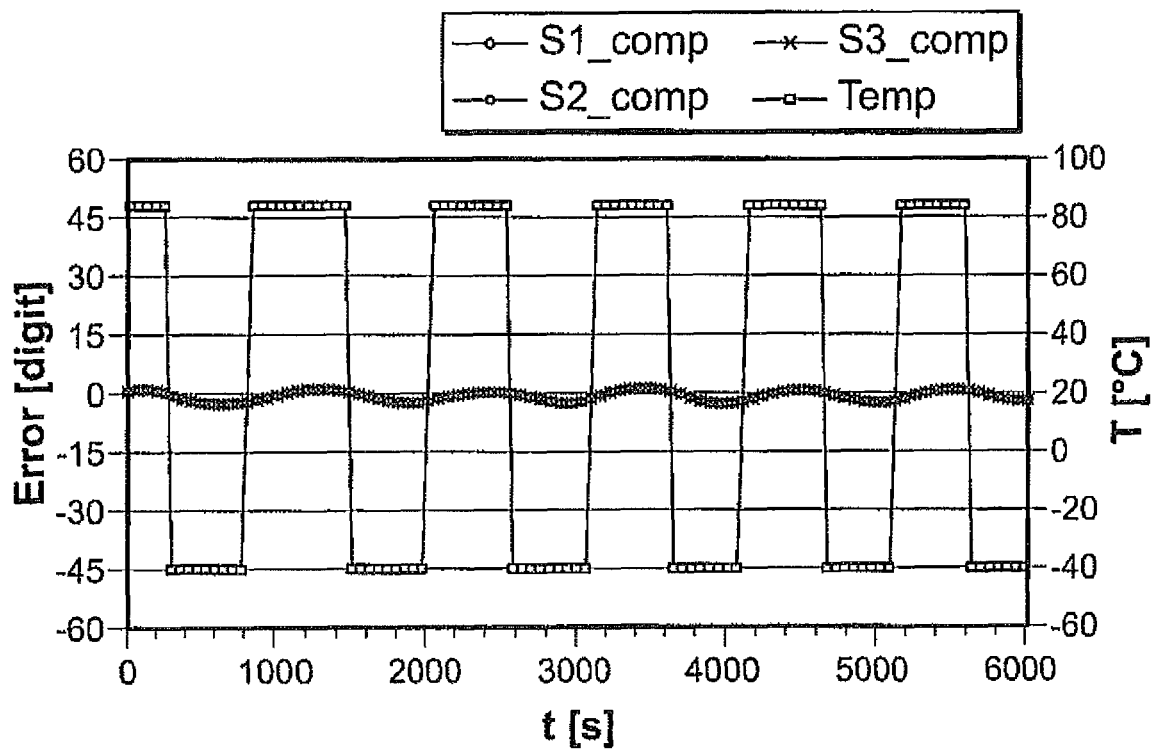
FIG. 8 is a graph of an error of the amplitude after applying temperature compensation to the amplitudes of FIG. 7.

An example of temperature compensation achieved by the present method is illustrated in FIGS. 7 and 8. FIG. 7 shows a variation of amplitude values (digitized) of sensing signals measured from three sensors S1 to S3 when applying a cyclic temperature oscillation between +85° C. and −40° C. The magnetic actuator 12 is at the upper position 14B so that it that does not affect the readings from the sensors S1 to S3. The measured values than essentially correspond to the variation of the offset voltages with temperature for the respective sensors S1 to S3. As shown in FIG. 7, the readings obtained for each sensor follow a similar temperature variation since the sensors S1 to S3 are not being activated by the magnetic field, and therefore, are only affected by temperature. FIG. 8 shows an amplitude error calculated as a difference between the amplitudes values obtained after applying a temperature-compensation algorithm to the amplitudes of the sensing signals shown in FIG. 7 and a known reference amplitude value at the respective temperature.

In an embodiment, one or several dedicated temperature measurement devices, such as conventional resistance thermometers, NTC (Negative Temperature Coefficient) and RTD (resistance Temperature Detector) sensors, may be provided at specific positions, namely, along the sensing path 20 such as, for example at the top and/or the bottom of the sensing path 20, so as to provide a more precise, independent temperature reference that can be used for adjusting the temperature estimation obtained from the magnetic sensor measurements.

The accuracy of the measurement of the magnetic actuator position and/or displacement performed by the magnetic sensing device 10 is improved by using the estimated distribution of temperature. For instance, the effect of the variation of temperature along the sensor array 18 may be compensated at the level of the raw sensing signals acquired from each of the array sensors S1 to S16 by using the known characteristic curves $V_{out}$ versus H of the magnetic switching sensors and the estimated sensor temperature. In this case, the raw sensing signals may undergo a temperature compensation processing by applying a suitable function that compensates the effect of the real sensor temperature on the sensing signal amplitude before the sensing signals are used for determining the position of the magnetic actuator 12.

Figure 9:
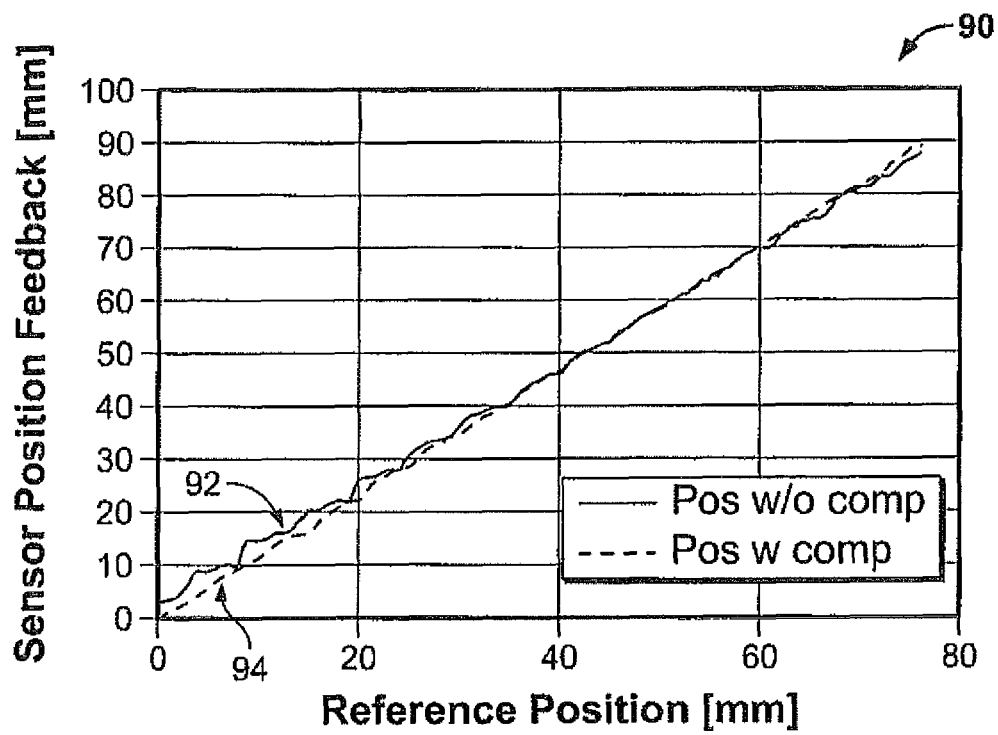
FIG. 9 is a graph of a position of a magnetic actuator detected by the magnetic sensor device as a function of a reference position of the magnetic actuator.
Figure 10:
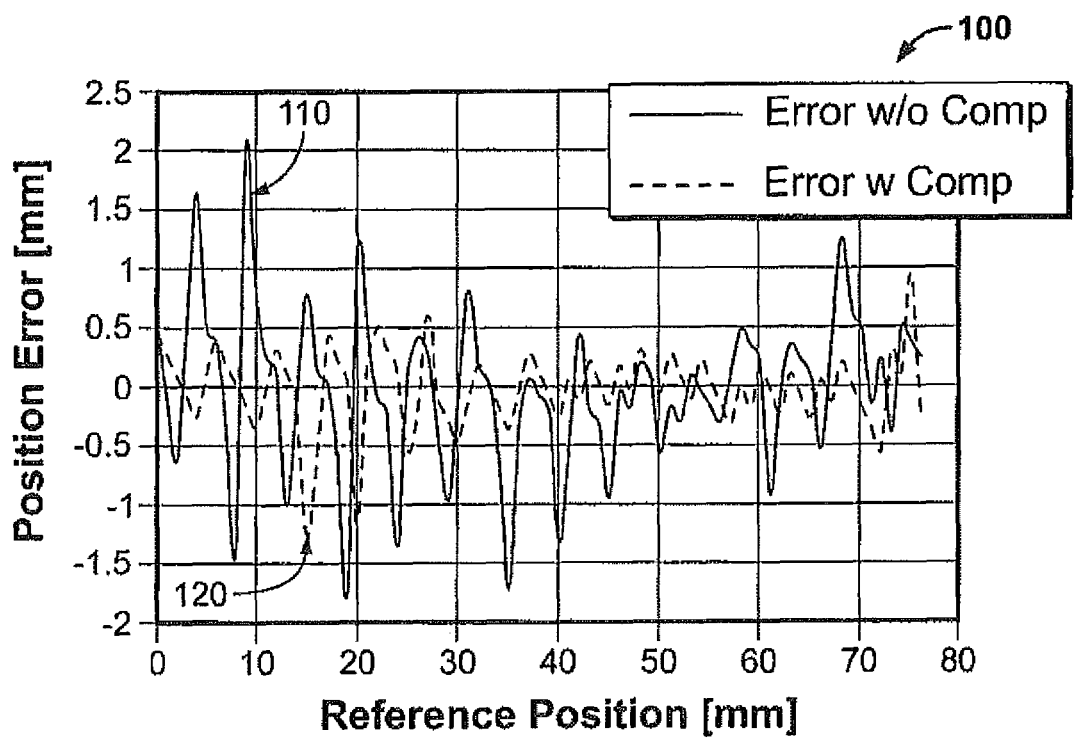
FIG. 10 is a graph of a variation of a position error from a comparison of the reference position of the magnetic actuator with and without temperature compensation.

Comparative examples illustrating the improvement in the position measurement precision achieved by the temperature compensation method according to the present invention are shown in FIGS. 9 and 10.

FIG. 9 depicts a chart 90 showing positions of the magnetic actuator 12 calculated based on the magnetic sensors measurements (sensor position feedback) as a function of a reference position of the magnetic actuator 12, without applying temperature compensation (solid curve 92) and when applying temperature compensation (dashed curve 94). In this specific example, the reference position may vary from 0 to 80 mm.

As shown in FIG. 9, the sensor position feedback without temperature compensation exhibits a noisy behavior that deviates from linearity at reference positions corresponding to the extremities of the sensing path (where the effects of temperature gradients can be expected to be more important), and most particularly, at the lowest reference positions. In contrast, noise and linearity of the sensor position feedback is significantly improved after temperature compensation, and the deviations from the reference position of the magnetic actuator 12 are minimized, even at the lower reference positions.

The deviation of the sensor position feedback with respect to the reference position (position error) is shown in further detail in the chart 100 of FIG. 10 as a function of the reference position for the cases where temperature compensation is not applied (solid curve 110) and when temperature compensation is applied (dashed curve 120). As shown in FIG. 10, the error position is significantly reduced when the temperature compensation is taken into account. In the particular application of level measurement devices, it is possible to attain an improvement in the level precision of about a factor of 2 to 4.

In some cases, the position of the magnetic actuator 12 may be obtained using a signal profile that is generated from raw sensing signals and which provides a progression of the sensing signal amplitude obtained at each coordinate position, i.e. the respective sensor position along the sensing path, at the moment when the magnetic actuator 12 was at the position to be determined. The position of the magnetic actuator 12 is then determined by comparing the generated signal profile with a reference signal profile that has been obtained when the magnetic actuator 12 was at a known, reference position, and stored in a look-up table. In this case, a compensation for the effect of a temperature gradient established over the sensor array 18 may be performed at the level of the generated signal profile or at the level of the stored reference profile. For instance, a temperature compensation algorithm may be applied to the values of the generated signal profile using the estimated temperature distribution, and the temperature-compensated values compared with the stored reference signal profile for determining the magnetic actuator position. In an alternative embodiment, the temperature-compensated values may be compared with a generic temperature compensation law that may be easily implemented in (sensor) software/signal processing. The comparison of the temperature-compensated values with the stored reference signal profile, or with the generic temperature law allows correcting distortions in the signal profile caused by the variation of temperature on the sensing signals obtained from each sensor before comparing with the reference signal profile, and therefore, improve accuracy in the position measurement. The estimated temperature values may be also used for applying a temperature correction factor on the reference values of the reference profile stored in the look-up table so as to reflect the present temperature situation in the reference signal profile. Thus, temperature compensation may be achieved by at least two ways: with a formula or generic temperature law which allows a continuous temperature-compensation without need of storing previously measured, reference values for the sensing signals, or with a set of previously measured, reference data, such as a look-up table with stored punctual values (non-continuous).

From the known output voltage characteristic of magnetic sensors, it is possible to determine a distribution of temperature over an array of magnetic sensors using the sensing signals from the array sensors that are not being significantly activated by the magnetic field created by the magnetic actuator 12 and without the need of employing additional temperature sensors.

Figure 11:
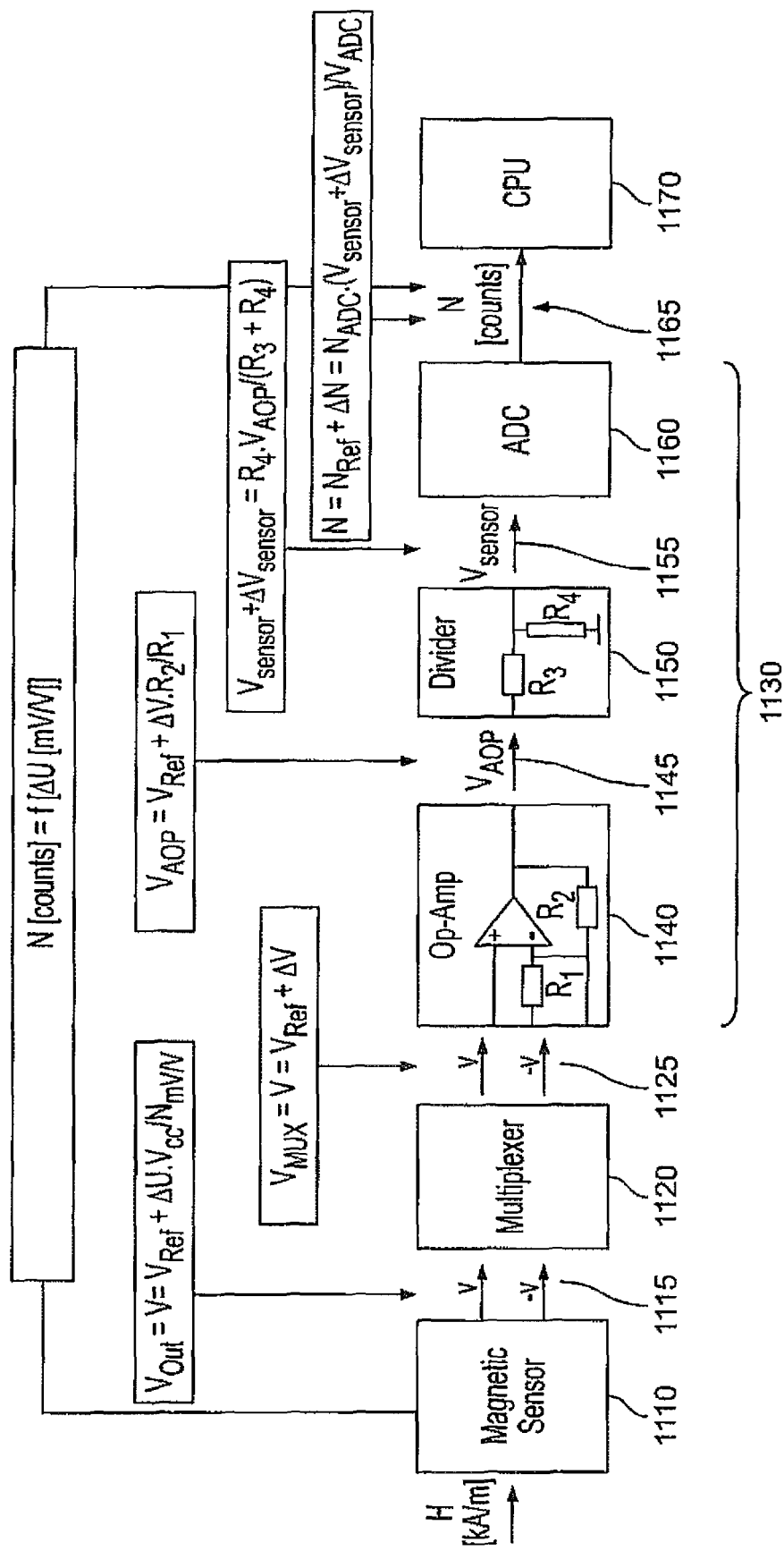
FIG. 11 is a circuit diagram for implementing a measurement and temperature compensation of magnetic signals according to an embodiment.

An exemplary circuit block diagram for implementing a measurement of magnetic signals according to the principles of the present invention will now be described with reference to FIG. 11. For ease of reference, the present embodiment will be described with reference to one magnetic sensor 1110. However, as described above, one or several magnetic sensors 1110 may be distributed along the sensing path 20 for detecting the displacement and/or position of the magnetic actuator 12, depending on the specific application. Referring to FIG. 11, when in operation, the magnetic sensor 1110 senses the magnetic field H produced by the magnetic actuator 12 at its current location and delivers a sensing signal 1115, $V_{out}$, characteristic of the magnetic sensor response at the local temperature and local magnetic field H. The analog signal $V_{out}$ depends on the raw signal output $\Delta U$ [mV/V] of the magnetic sensor 1110 and known sensor parameters $V_{Ref}$, $V_{cc}$ (sensor supply voltage), and $N_{mV/V}$, by the relation $$V_{out} = V_{Ref} + \Delta U \cdot V_{cc}/N_{mV/V} \quad (5)$$

wherein $V_{Ref}$ is an electronic reference voltage of the magnetic sensor, the measured output being added to this reference voltage, and $N_{mV/V}$ is a known conversion factor (for e.g. 1000 to convert from $\Delta U$ (mV/V) to $\Delta U$ (V/V)).

When more than one sensing signal $V_{out}$ is present, a multiplexer 1120 is provided to allow selecting one of the several analog input sensor signals $V_{out}$ and to forward the selected analog sensor signal 1125, $V_{MUX}$, to a measuring system 1130. In the shown embodiment, the selected analog signals output by the multiplexer 1120 are represented as $V_{MUX} = V_{Ref} + \Delta V$.

The measuring system 1130 includes an operational amplifier 1140 for amplifying the selected analog signal $V_{MUX}$ received from the multiplexer 1120 so as to increase the voltage measurement sensibility and output an amplified voltage sensing signal 1145, $V_{AOP}$. In the shown embodiment, the amplified voltage sensing signal $V_{AOP}$ is represented as $V_{AOP} = V_{Ref} + R_2 \Delta V/R_1$. In addition or optionally, the measuring system 1130 may include a voltage divider 1150 for filtering the amplified voltage sensing signal $V_{AOP}$ output by the operational amplifier 1140, resulting in a filtered analog measurement signal 1155, $V_{sensor}$, which according to the present embodiment may be expressed as a function resistance parameters $R_3$ and $R_4$ of the voltage divider 1150 as $V_{sensor} = V_{sensor,Ref} + \Delta V_{sensor} = R_4 \cdot V_{AOP}/(R_3 + R_4)$, wherein $V_{sensor,Ref}$ corresponds to the output when $\Delta U = 0$ The resultant voltage measurement signal $V_{sensor}$ may then be fed to an analog-to-digital converter 1160 (ADC), which converts the analog signal $V_{sensor}$ into a digital measurement signal 1165, i.e. a numeric signal N[counts]. The numerical signal N[counts] may then be used in dedicated algorithms for calculating the position and/or relative displacement of the magnetic actuator 12 from the magnetic sensor signals, such as algorithms conventionally used in level and/or position measurements.

In the embodiment shown in FIG. 11, the digital measurement signal N[counts] is obtained by digitizing the signal $V_{sensor}$ that results from raw measurement signal after applying operations of multiplexing, amplification and voltage division. However, a measurement circuit configuration may be envisaged in which one or more of the multiplexing, amplification and voltage division operations are omitted, depending on the application. For instance, the measurement sensing signal $V_{out}$ output by the magnetic sensor 1110 may be directly fed to the ADC 1160 for conversion into a respective digital measurement signal. Alternatively, the analog signal $V_{sensor}$ fed to the ADC 1160 may be the result of applying only one or some of the operations of multiplexing, amplification, and filtering described above to the raw sensing signal $V_{out}$ measured by the magnetic sensor 1110.

In the shown embodiment, the resulting numeric signal N [counts] is a digital measurement obtained from the analog signal $V_{out}$ and therefore, depends on the quantity $\Delta U$ [mV/V] measured by the magnetic sensor 1110 that reflects the sensor response to the applied magnetic field and temperature. Thus, the numeric signal N [counts] depends on the quantity $\Delta U$ [mV/V] according to a known function $f(\Delta U$ [mV/V]), which may be used when performing temperature compensation. Inversely, the quantity $\Delta U$[mV/V] can be recalculated through the numeric signal N[counts], by applying an inverse function $f^{-1}(N$ [counts]) on the numeric signal N [counts]. The inverse function $f^{-1}(N[counts])$ may be used for temperature compensation of the sensing signals measured by the magnetic sensor 1110.

The compensation for temperature and/or temperature gradients effects on the digital measurement signal N [counts] is performed in dedicated processor 1170, such as a CPU. The processor 1170 executes computer program instructions stored on a non-transitory computer-readable medium to carry out the temperature compensation described herein. The temperature-compensated signals are further processed by the processor 1170 for determining position and/or displacement of the magnetic actuator 12 using algorithms known in the field. For instance, in one embodiment, a digital measurement that includes a temperature compensation correction may be obtained using the following method. First, the quantity ΔU[mV/V] that affects the analog sensing signal of the magnetic sensor 1110 is calculated from the digital signal N[counts] obtained as described above by using the known function $f^{-1}$(N [counts]). A corrected voltage quantity $\Delta U_{corrected}$ [mV/V] that takes in account the local temperature of the magnetic sensor may be then calculated using a second function F2 (T, ΔU, Hs) characteristic of the magnetic sensor and the respective estimated temperature T. A temperature compensated digital measurement $N_{corrected}$[counts] may then be obtained by applying the reciprocal of the function F1 using the corrected quantity $\Delta U_{corrected}$ [mV/V]. The above steps are summarized in the following compensation scheme:

ΔU [mV/V]=$f^{-1}$(N[counts]);
$\Delta U_{corrected}$ [mV/V]=F2 (T, ΔU, Hs);
$N_{corrected}$[counts]=f($\Delta U_{corrected}$ [mV/V]).

In an alternative embodiment, temperature compensation may be achieved by estimating a corrected digital measurement $N_{corrected}$[counts] using a known function F (T, N[counts]−$N_{stable}$[counts]) that provides a corrected value $N_{corrected}$[counts] based on the local temperature T and a difference between the digital measurement value N[counts] (i.e. without temperature compensation) and a reference digital measurement value $N_{stable}$ (i.e. temperature independent) that corresponds to the analog signal output by the magnetic sensor at the switching point Hs.

The estimation of temperature distribution and respective temperature compensation described above may also be used for compensating self-heating effects of the magnetic sensing device 10. For instance, when the printed circuit board on which the magnetic sensors are mounted is powered, the CPU 1170 of the magnetic sensing device 10 may induce an increase of the circuit board temperature that will impact the temperature in the surrounding magnetic sensor (s) 1110. Thus, the temperature compensation method of the present invention also allows compensating for the effects associated with an increase of temperature of the magnetic sensors caused by the internal operation of the magnetic sensing device 10.

The present invention may be implemented in magnetic sensing devices that are used for measurement of absolute position or displacement in a wide range of technical fields such as in the automotive industry, agricultural machines (for example in position monitoring of mowers), construction machinery (for example detecting the position of an excavator arm) and medical applications, such as in the positioning of hospital beds or positioning of an pestle in syringe pumps.

Although in the configuration described above, the set of magnetic sensors was described as including sixteen magnetic sensors S1 to S16, the number of sensors is not limited to 16 and the set may include two or more sensors depending on the requirements of the specific application, such as total length of the sensing (measurement) path, resolution of the position measurement, etc. In addition, the plurality of sensors may be evenly spaced along the measuring path, or in an uneven manner depending on the specific application. Moreover, as mentioned above, the magnetic sensor array is not limited to a linear chain of magnetic sensors, as in the illustrated embodiments, and may adopt other configurations. For instance, the magnetic sensors may be arranged along a curved path to follow a curvilinear movement of the magnetic actuator.

What is claimed is:

1. A method of compensating for an effect of temperature, comprising:
providing a set of magnetic sensors arranged along a sensing path, each magnetic sensor adapted to sense a magnetic field created by a magnetic actuator which can move along the sensing path and to provide a sensing signal indicative of a position and/or a displacement of the magnetic actuator relative to the sensing path;
selecting one or more magnetic sensors from the set of magnetic sensors for use as temperature sensors;
estimating a distribution of temperature over at least a portion of the sensing path based on the sensing signals output by the one or more magnetic sensors selected as temperature sensors; and
compensating for the effect of temperature on the sensing signals output by one or more magnetic sensors of the set of magnetic sensors using the distribution of temperature that was estimated.

2. The method of claim 1, wherein the selecting step includes applying a filtering function adapted to select the magnetic sensors that, at a current position of the magnetic actuator relative to the sensing path, are not substantially actuated by the magnetic field created by the magnetic actuator.

3. The method of claim 2, wherein the filtering function includes evaluating an amplitude of each of the sensing signals output by the set of magnetic sensors and selecting the magnetic sensors corresponding to the sensing signals whose amplitude changes within a predetermined amplitude range.

4. The method of claim 1, wherein the estimating step includes adjusting the estimated temperatures using a temperature measurement from at least one dedicated temperature measurement device located at a predetermined position, the temperature measurement being used as a reference temperature for adjusting the estimated distribution of temperatures.

5. The method of claim 1, wherein the estimating step includes, for at least one of the selected magnetic sensors, calculating a temperature of the selected magnetic sensor based on the amplitude of the respective sensing signal and a characteristic correlation between an offset amplitude and temperature for the magnetic sensor.

6. The method of claim 5, wherein the estimating step includes, for at least one of the non-selected magnetic sensors, estimating a temperature of the respective magnetic sensor by interpolating and/or extrapolating the temperatures calculated for the at least one selected magnetic sensors.

7. The method of claim 6, wherein the characteristic correlation is such that a change of temperature with respect to a reference temperature causes a proportional change of the offset amplitude.

8. The method of claim 7, wherein the temperature for the at least one selected magnetic sensor is determined using the amplitude of the respective sensing signal and values of the reference temperature, a reference value of the offset amplitude, and an offset temperature coefficient characteristic of the selected magnetic sensor.

9. The method of claim 1, wherein the compensating step includes determining a temperature-compensated amplitude of the output sensing signals for each magnetic sensor of the set of magnetic sensors using the estimated temperature distribution and a temperature law followed by the output sensing signals.

10. The method of claim 1, wherein the compensating step includes determining a temperature-compensated value corresponding to the sensing values that are stored in a look-up table by using the estimated temperature distribution, the look-up table assigns a sensing value to each of the set of magnetic sensors for the position of the magnetic actuator at which the sensing signals have been acquired, the position or displacement of the magnetic actuator is determined based on a comparison of the temperature-compensated values with a temperature law or with a stored profile of reference values of the sensing signals previously acquired for a known reference position of the magnetic actuator.

11. A magnetic field sensing apparatus, comprising:
a set of magnetic sensors arranged along a sensing path, each magnetic sensor is adapted to sense a magnetic field created by a magnetic actuator and to output a sensing signal indicative of a position and/or a displacement of the magnetic actuator relative to the sensing path; and
a processor adapted to perform signal processing of the sensing signals for determining the position and/or the displacement of the magnetic actuator, the signal processing including:
selecting one or more magnetic sensors from the set of magnetic sensors for use as temperature sensors;
estimating a distribution of temperature over at least a portion of the sensing path based on the sensing signals output by the selected one or more magnetic sensors; and
compensating for an effect of temperature on the sensing signals output by one or more magnetic sensors of the set of magnetic sensors using the estimated temperature distribution.

12. The magnetic field sensing apparatus of claim 11, wherein selecting the one or more magnetic sensors includes applying a filtering function adapted to select the magnetic sensors that, at a current position of the magnetic actuator relative to the sensing path, are not substantially actuated by the magnetic field created by the magnetic actuator.

13. The magnetic field sensing apparatus of claim 12, wherein the set of magnetic sensors includes a single magnetic sensor or a plurality of magnetic sensors distributed along the sensing path.

14. The magnetic field sensing apparatus of claim 13, further comprising a dedicated temperature measurement device located at a predetermined position and configured to provide a temperature measurement to be used as a reference temperature for adjusting the estimated distribution of temperatures.

15. The magnetic field sensing apparatus of claim 14, wherein the filtering function includes evaluating an amplitude of each of the sensing signals output by the set of magnetic sensors and selecting the magnetic sensors corresponding to the sensing signals whose amplitude changes within a predetermined amplitude range.

16. The magnetic field sensing apparatus of claim 11, wherein the estimating includes, for at least one of the selected magnetic sensors, calculating a temperature of the selected magnetic sensor based on the amplitude of the respective sensing signal and a characteristic correlation between an offset amplitude and temperature for the magnetic sensor, and for at least one of the non-selected magnetic sensors, estimating the temperature of the respective magnetic sensor by interpolating and/or extrapolating the temperatures calculated for the at least one selected magnetic sensors.

17. The magnetic field sensing apparatus of claim 16, wherein the magnetic sensors are magnetic weak field sensors that exhibit a characteristic correlation between temperature and an offset amplitude such that a change of temperature with respect to a reference temperature causes a proportional change of the offset amplitude, the temperature for the at least one selected magnetic sensor is determined using the amplitude of the respective sensing signal and values of the reference temperature, a reference value of the offset amplitude, and an offset temperature coefficient characteristic of the selected magnetic sensor.

18. The magnetic field sensing apparatus of claim 11, wherein the compensating includes:
determining a temperature-compensated amplitude of the output sensing signals for each magnetic sensor of the set of magnetic sensors using the estimated temperature distribution and a temperature law followed by the output sensing signals; or
determining a temperature-compensated value corresponding to the sensing values that are stored in a look-up table by using the estimated temperature distribution, the look-up table assigns a sensing value to each of the set of magnetic sensors for the position of the magnetic actuator at which the sensing signals have been acquired, the position or the displacement of the magnetic actuator is determined based on a comparison of the temperature-compensated values with a temperature law or with a stored profile of reference values of the sensing signals previously acquired for a known reference position of the magnetic actuator.

19. The magnetic field sensing apparatus of claim 11, wherein the magnetic field sensing device is configured to perform measurements of a level of a fluid contained in a fluid container, and the magnetic actuator includes a floating body adapted to float at the fluid surface.

20. A non-transitory computer-readable medium having instructions stored thereon and executable by a processor for carrying out the temperature compensation method of claim 1.

* * * * *